United States Patent [19]

Adlerstein

[11] 4,374,012
[45] Feb. 15, 1983

[54] METHOD OF MAKING SEMICONDUCTOR DEVICE HAVING IMPROVED SCHOTTKY-BARRIER JUNCTION

[75] Inventor: Michael G. Adlerstein, Wellesley, Mass.

[73] Assignee: Raytheon Company, Lexington, Mass.

[21] Appl. No.: 275,081

[22] Filed: Jun. 18, 1981

Related U.S. Application Data

[60] Continuation of Ser. No. 75,353, Sep. 13, 1979, abandoned, which is a division of Ser. No. 833,317, Sep. 14, 1977, Pat. No. 4,197,551.

[51] Int. Cl.³ .......................................... C23C 15/00
[52] U.S. Cl. ............................. 204/192 SP; 156/649; 204/192 C
[58] Field of Search ................. 204/192 SP, 192 C; 156/649; 357/15

[56] References Cited

U.S. PATENT DOCUMENTS

| 3,451,912 | 6/1969 | D'Heurle et al. | 204/192 |
|---|---|---|---|
| 3,551,842 | 12/1970 | Nelson | 372/46 |
| 3,609,472 | 9/1971 | Bailey | 357/71 |
| 3,752,702 | 8/1973 | Iizuka et al. | 427/86 |
| 3,755,752 | 8/1973 | Kim | 330/287 |
| 3,798,145 | 3/1974 | Fournier | 204/192 |
| 3,896,473 | 7/1975 | DiLorenzo et al. | 357/15 |
| 3,906,541 | 9/1975 | Goronkin | 357/22 |
| 3,927,225 | 12/1975 | Cordes et al. | 427/84 |
| 3,935,586 | 1/1976 | Landheer et al. | 357/15 |
| 3,938,243 | 2/1976 | Rosvold | 29/578 |
| 3,995,301 | 11/1976 | Magdo | 357/15 |
| 4,016,643 | 4/1977 | Pucel et al. | 29/571 |
| 4,034,394 | 7/1977 | Kamo et al. | 357/15 |
| 4,062,103 | 12/1972 | Yamagishi | 29/580 |
| 4,110,488 | 8/1978 | Risko | 427/84 |

OTHER PUBLICATIONS

Electronics Letters, vol. 11, No. 18, Sep. 4, 1975, High Power C Band Impatt Diodes, pp. 430-431.

Primary Examiner—Aaron Weisstuch
Attorney, Agent, or Firm—Richard M. Sharkansky; Joseph D. Pannone

[57] ABSTRACT

A semiconductor device having an improved non-diffusive Schottky-barrier junction and metallization layers and method for producing the same. A thin layer of a Schottky-barrier forming metal such as platinum is sputter deposited upon a hot gallium arsenide substrate, thereby impact alloying a portion of the Schottky-barrier forming metal with the gallium arsenide material. A refractive metal such as titanium is then sputtered above the Schottky-barrier forming layer at a power level sufficient to alloy the remaining Schottky-barrier forming metal with the refractive metal. A highly conductive layer such as gold is then sputter deposited over the refractive layer to provide ohmic contact. The invention may be used to particular advantage in microwave diode and field effect transistor devices.

10 Claims, 10 Drawing Figures

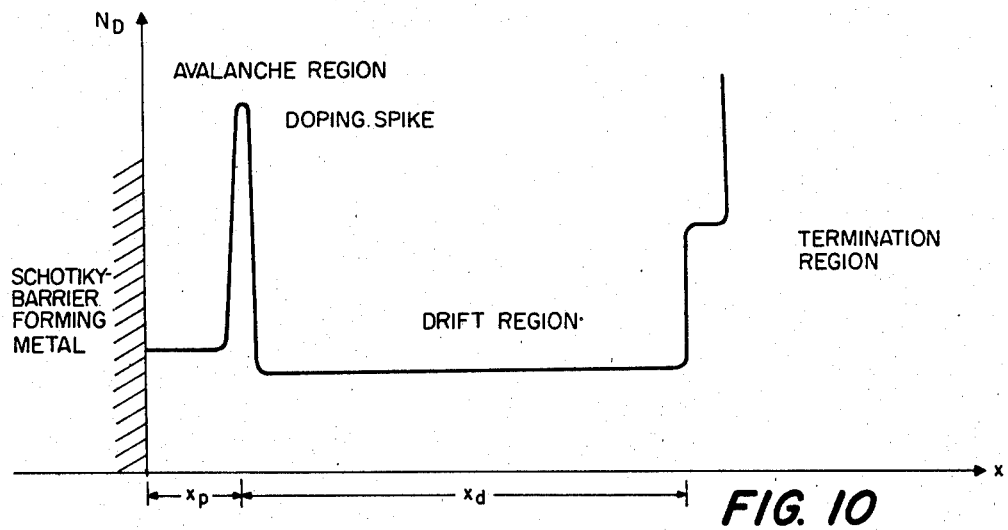
FIG. 10
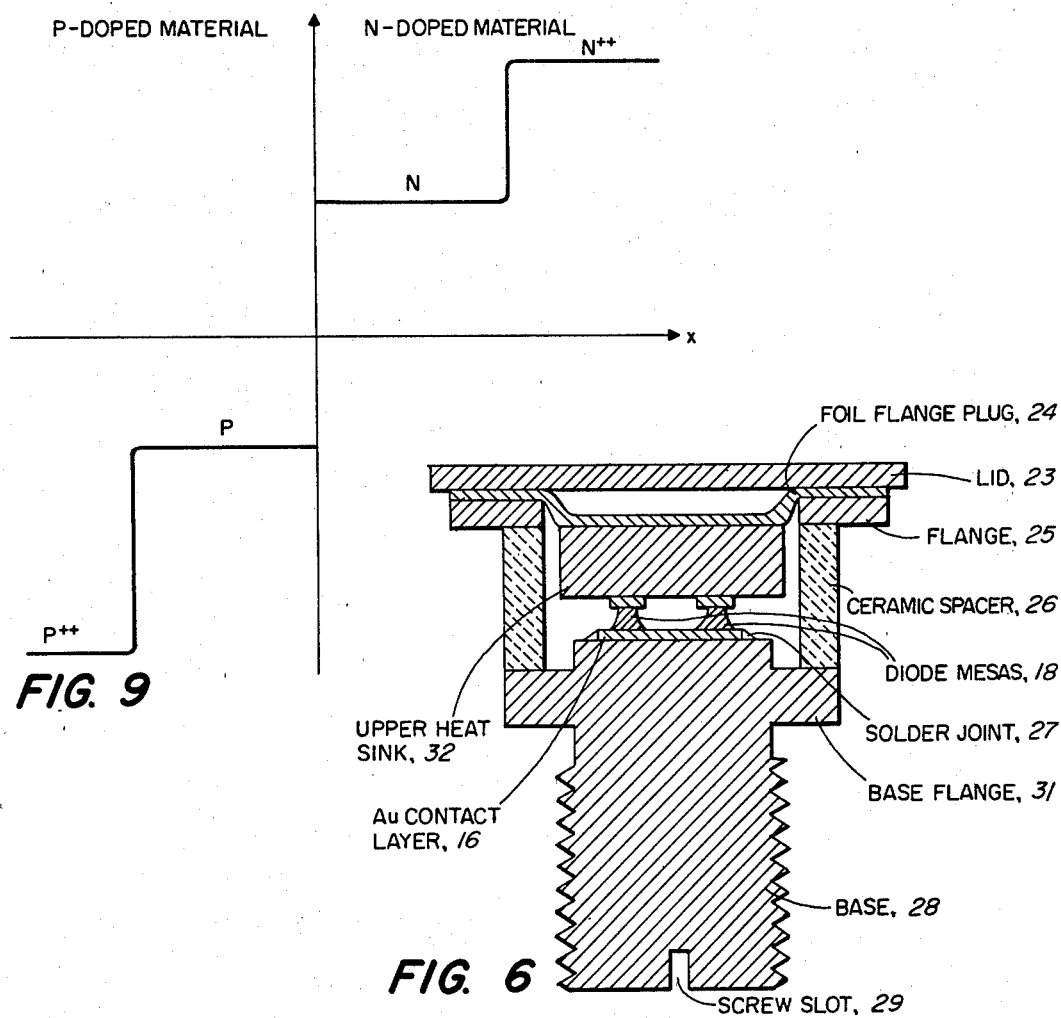
FIG. 9
FIG. 6

METHOD OF MAKING SEMICONDUCTOR DEVICE HAVING IMPROVED SCHOTTKY-BARRIER JUNCTION

CROSS-REFERENCE TO RELATED CASES

This is a continuation of application Ser. No. 075,353, filed Sept. 13, 1979, now abandoned, which was a division of application Ser. No. 833,317 filed Sept. 14, 1977, now U.S. Pat. No. 4,197,551.

BACKGROUND OF THE INVENTION

1. Field of the Invention

The invention pertains to semiconductor devices having a Schottky-barrier contact and in particular to such devices constructed for operation in the microwave frequency ranges in which a stable contact is desired.

2. Description of the Prior Art

In prior art microwave diodes and field effect transistors employing Schottky-barrier contacts, the contact was ordinarily formed by a layer of platinum or other Schottky-barrier forming metal deposited upon a semiconductor surface in a desired pattern with a layer of highly conductive metal such as gold deposited over the platinum layer to provide external contact. The platinum layer was made thick enough to prevent atoms of the gold layer from migrating through pinholes or grain boundaries in the platinum layer into the semiconductor material and, by their presence in the semiconductor material, degrading the performance of the device. Unfortunately, the excess platinum over that which was required to form the Schottky-barrier junction allowed for continuing alloying between the platinum and semiconductor material during high temperature conditioning and operation of the device. The position of the Schottky barrier effectively moved further into the semiconductor material as the alloying-process continued. With many devices such as Read-type IMPATT diodes, such movement is quite undesirable as the position of the Schottky-barrier junction determines one boundary of the avalanche or charge carrier creation region. In some configurations of such devices, the frequency of operation of the device was changed as the junction moved.

SUMMARY OF THE INVENTION

Accordingly, it is an object of the present invention to provide a semiconductor device having a position-stable Schottky barrier junction.

Also, it is an object of the present invention to provide such a semiconductor device in which atoms of the contact layer are prevented from migrating into the semiconductor material.

Furthermore, it is an object of the present invention to provide such a device in which only a minimal thickness of Schottky-barrier forming metal is required.

These, as well as other objects of the invention, may be met by providing the combination of a body of semiconductor material, a layer comprising an alloy of the semiconductor material and a first metal upon at least portions of a surface of the body of semiconductor material, and a layer of a second metal disposed upon the alloy layer. The first metal is of a type which will form a Schottky-barrier junction with the semiconductor material. A third metal layer may be disposed upon the second metal layer. Preferably, the metal of the second layer is a refractive metal such as titanium, tungsten or hafnium, while that of the third is highly conductive. The body of semiconductor material has a plurality of layers of the same type of semiconductor material with at least some of the layers being of different conductivity.

Objects of the invention may also be met by providing the combination of semiconductor material, a layer of alloy of the same semiconductor material and a first metal disposed upon at least portions of a surface of the body of semiconductor material, a layer comprising an alloy of the first metal and a second metal disposed upon the layer of first metal, and a layer of the second metal disposed upon the layer comprising an alloy of the first metal and second metal. The first metal is again preferably of the type which forms a Schottky-barrier junction with the chosen semiconductor material. A layer of third metal disposed upon the second metal layer may also be provided. As before, the second metal is preferably refractive, while the third metal is highly conductive.

Still further, objects of the invention may be met by a semiconductor diode comprising the combination of a body of gallium arsenide semiconductor material, a layer consisting of an alloy of platinum and gallium arsenide disposed upon at least a portion of the surface of the body of gallium arsenide semiconductor material, a layer consisting of an alloy of platinum and titanium, and a layer of gold disposed upon the layer of titanium. The body of gallium arsenide semiconductor material may have a doping profile for an IMPATT diode, or, more specifically, for a Read-type IMPATT diode. The preferred thickness of the platinum layer is in the range of 100 to 300 Å while the preferred thickness of the titanium layer is in the range of 1000 to 2000 Å.

A field effect transistor device may be constructed in accordance with the teachings of the invention by providing a body of gallium arsenide semiconductor material having a first contact upon the body of gallium arsenide material comprising a layer consisting of an alloy of platinum and gallium arsenide disposed upon predetermined portions of the surface of the body of gallium arsenide semiconductor material, a layer consisting of platinum and titanium disposed upon the layer of alloy of platinum and gallium arsenide, a layer of titanium disposed upon the alloy layer of platinum and titanium and a layer of gold disposed upon the layer of titanium and further having second and third contacts upon the body of gallium arsenide semiconductor material, each of which comprises a layer of non-Schottky barrier-forming material. The layer of non-Schottky barrier-forming metal may be selected from the group consisting of a eutectic mixture of gold and germanium and a eutectic mixture of gold and nickel. The first contact is preferably located between the second and third contacts. A plurality of each of the first, second and third contacts may be provided in a multi-transistor composite device.

The invention may also be practiced by the method comprising the steps of providing a body of semiconductor material, sputtering a Schottky-barrier forming metal upon at least a portion of the surface of the body of semiconductor material at a sputtering power level sufficient to cause alloying between a portion of the semiconductor material and at least a portion of the sputtered Schottky-barrier forming metal, sputtering a layer of a refractory metal over the sputtered Schottky-barrier forming metal, and sputtering a layer of highly conductive metal over the layer of refractory metal. The body of the semiconductor material should be heated to a temperature in the range of 300° C. to 350° C. prior to sputtering the Schottky-barrier forming metal. The refractory metal should be sputtered at a level sufficient to cause alloying between at least portions of the Schottky-barrier forming metal not alloyed with the semiconductor material and a portion of the layer of refractory material. The semiconductor material in preferred embodiments comprises gallium arsenide, while the Schottky-barrier forming metal comprises platinum. The refractory metal may be titanium while the highly conductive metal may be gold.

The invention may further be practiced by the method comprising the steps of providing a body of gallium arsenide semiconductor material, heating the body of semiconductor material to a temperature within the range of 300° C. to 350° C., sputtering a layer of platinum upon a first surface of said body in predetermined locations at a sputtering power level in 0.5 to 2.7 watts/cm$^2$ with a preferred operating point of 0.8 watts/cm$^2$ to a thickness in the range of 100 to 300 Å, cooling the body to a temperature below 40° C., sputtering a layer of titanium over the layer of platinum at a sputtering power level in the range of 1.4 to 4.4 watts/cm$^2$ with a preferred operating point of 2.7 watts/cm$^2$ to a thickness in the range of 1000 to 2000 Å, cooling the body to a temperature of approximately 30° C., and sputtering a layer of gold over the layer of titanium. A layer of gold-germanium alloy may be then sputtered upon a second section or upon a second portion of the first surface or upon predetermined portions of a second surface of the semiconductor material body with a layer of gold deposited over the gold-germanium alloy layer. Portions of the layer of gold-germanium alloy and underlying portions of the semiconductor material may then be etched away leaving the remaining portion of the layer of gold-germanium alloy and of the body of semiconductor material in the form of mesas underlying the discs formed from the gold layer. A heat sink may then be coupled both thermally and electrically to the gold discs.

BRIEF DESCRIPTION OF THE DRAWINGS

FIG. 6 is a cross-sectional view of a completed packaged device in accordance with the invention;

FIG. 9 is a graph showing a preferred doping density profile for the semiconductor material used with the invention; and FIG. 10 is a graph showing an alternative preferred doping density profile for the semiconductor material used with the invention.

DESCRIPTION OF THE PREFERRED EMBODIMENTS

Figure 1:
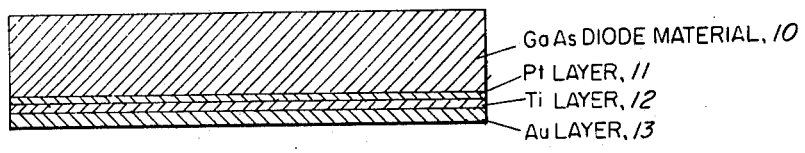
FIGS. 1–4 are a series of cross-sectional views showing steps in the construction of a semiconductor device in accordance with the invention.

Construction of semiconductor devices in accordance with the teachings of the present invention will be initially described in conjunction with the cross-sectional views of FIGS. 1–4. Referring first to FIG. 1, there is shown in cross-section a layer of substrate of gallium arsenide semiconductor diode material 10. Diode material 10 may have one of many different doping density profiles depending upon the particular application at hand. For example, diode material 10 may have the doping profile of a single-drift region IMPATT avalanche diode. A double-drift region IMPATT avalanche diode doping profile may also be used to particular advantage with the invention.

Referring momentarily to the graph of FIG. 9, the preferred doping profile of the double-drift IMPATT avalanche diode is illustrated. The material is formed in four regions, two of them being doped with an N- or negative-type dopant while the other two are doped with a P- or positive-type dopant. A diode junction is formed substantially at the center of the material between the P and N moderately doped layers. Avalanching of charge carriers takes place on either side of the diode junction within a portion both the P and N layers. The positive and negative charge carriers generated by avalanching are pulled by an electric field outward toward the P++ and N++ heavily doped regions, producing a time delay between the time of generation of the carriers near the diode junction and the time they reach the heavily-doped region. This time delay corresponds to an 180° phase shift between input and output signals and a diode circuit. The charge carriers in both the P and N regions, upon reaching the P++ and N++ regions respectively, recombine producing a conduction current in the output circuitry. A particular diode device used with the invention which has been found to function well with an N doping density of approximately $1.5 \times 10^{16}$/cm$^3$, a doping density in the N++ region of $2 \times 10^{18}$/cm$^3$, a density of $1.3 \times 10^{16}$/cm$^3$ in the P region and a doping density of approximately $10^{19}$/cm$^3$ in the P++ region. The N layer may have a width in the range of 3.5 to 4.5 microns, depending upon the frequency of operation desired. For the same range of frequencies, the P region may have a width in the range of 3.0 to 3.5 microns. Widths of 5.0 to 8.0 microns for the N++ layer and approximately 1.0 micron for the P++ layer have been found to function adequately.

Most of the heat generated within the material having the doping density profile shown in FIG. 9 is produced in the avalanche regions adjacent the diode junction in the center of the device. The maximum amount of power which can be handled with such a device is, of course, dependent upon the junction temperature. The junction temperature is in turn dependent upon the rate at which heat may be extracted from the device. Since with the double-drift structure it is not possible to place a heat sink immediately adjacent the junction because of the presence of active material extending for appreciable distances on both sides of the junction, heat removal has been a serious problem severely limiting the maximum power at which such devices may be employed.

Referring now to FIG. 10, there is shown a graph of a single-drift Read-type IMPATT diode with which the invention may also be used to advantage. An avalanche region is formed with an N-type semiconductor material adjacent a metal layer suitable for forming a Schottky-barrier junction. A layer of platinum may be used with gallium arsenide semiconductor material to form such a junction. A thin doping spike of heavily doped semiconductor material terminates the avalanche region and confines the avalanche of charge carriers strictly between the layer of Schottky-barrier forming metal and the doping spike. The charge carriers produced within the avalanche region are pulled through the drift region of moderately-doped material by the externally applied electric field. Upon reaching the termination region, the charge carriers recombine, forming a conduction current which flows in the external circuitry. A two-layered heavily-doped termination region may be used with the layer immediately adjacent the drift region being less heavily doped to prevent carrier injection from defects at the interface between the drift region and termination region and the consequent generation of an unwanted reverse current. As in the previously described double-drift avalanche diode, heat removal is also a severe problem with this type of device.

Referring again to FIG. 1, the steps in the construction of a device in accordance with the teachings of the present invention will be discussed in further detail. For use with diode material having a doping density in accordance with that specified in FIG. 10, a three-layer metallization pattern is deposited over one surface of diode material 10 with a layer of Schottky-barrier forming metal in contact with the surface of diode material 10. For the case of the double-drift structure shown in FIG. 10, the highly doped P++ layer may be omitted as the three-layer metallization described will form a good ohmic contact with P-type gallium arsenide material. Also, with the double-drift IMPATT avalanche diode specified in FIG. 9, the three-layer metallization may be replaced, for example, by some other metallization system. With the embodiment shown in FIG. 1, first a layer 11 of platinum is sputtered upon the surface of gallium-arsenide diode material 10. Upon platinum layer 11 is then sputtered layer 12. Titanium is the preferred material although tungsten, hafnium, or other refractory metals may be used as well for layer 12. Next, gold layer 13 is sputtered over titanium layer 12. Highly conductive gold layer 13 is sputter deposited upon titanium layer 12 and forms the lower contact to the diode.

In accordance with one aspect of the invention, a particularly advantageous sputtering process is used which results in a device in which the gold layer is prevented from diffusing through the platinum layer into diode material 10 and adversely affecting some of the electrical properties of the material. In accordance with the invention, diode material 10 is first heated to a temperature in the range of 300° to 350° C., with 330° C. being a preferred operating point. Platinum layer 11 is then sputtered upon the surface of diode material 10 with a sputtering power in the range of 0.5 to 2.7 watts/cm$^2$ with a preferred operating point of 0.8 watts/cm$^2$ to a preferred thickness in the range of 100 to 300 Å. A thickness of 200 Å has been found to function well. During this initial sputtering operation, a portion of platinum layer 11 reacts with the gallium arsenide material forming an alloy therewith. Diode material 10 is then cooled to a temperature in the range of 20°-to 40° C., with 30° C. being a preferred operating point, and a layer 12 of titanium having a thickness in the range of 1000 Å to 2000 Å is sputtered over platinum layer 11 at a relatively high sputtering power level in the preferred range of 1.4 to 4.4 watts/cm$^2$ with a preferred operating point of 2.7 watts/cm$^2$. The relatively high titanium power level causes impact alloying between the remaining platinum and the titanium material, forming a compound which reacts chemically much more slowly with gallium arsenide than does pure platinum. Moreover, atoms of gold layer 13 are not able to migrate through the barrier thus formed. Still further, it has unexpectedly been found that diode devices constructed in accordance with the above-described sputtering process exhibit substantially lower noise measures than for diodes having an ordinary Schottky-barrier contact with the gold layer immediately adjacent the Schottky-barrier forming metal.

Figure 2:
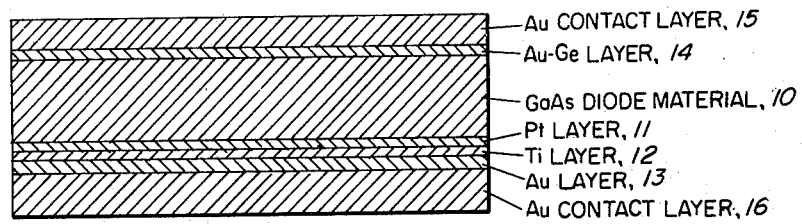

Referring next to FIG. 2, a layer of gold-germanium eutectic alloy is evaporated upon the surface of gallium arsenide diode material 10 opposite that upon which the platinum-titanium-gold layers were deposited. This surface corresponds to the outer side of the termination region of a device having a profile shown in FIG. 10. Atop gold-germanium layer 14 is plated gold contact layer 15. Similarly, gold contact layer 16 is plated above previously deposited gold layer 13.

Figure 3:
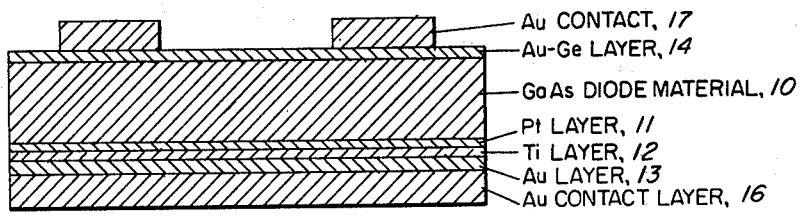

Next, as shown in the view of FIG. 3, gold-contact layer 15 is masked and chemically etched away in predetermined locations, using well-known photoresist techniques, to leave a plurality of circular gold contacts 17 atop positions at which diode mesas are to be formed. Ordinarily, many more contacts could be formed upon a single semiconductor wafer than are herein shown. For large-scale production, many hundreds of such contacts could be formed upon one wafer; then the diode mesa devices would be diced apart singly or in groups as desired.

Figure 4:
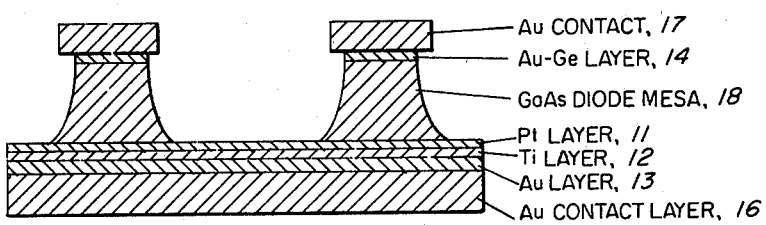

Next, as illustrated in the view of FIG. 4, gold-germanium layer 14 and portions of diode material 10 are chemically etched away between gold contacts 17 to form individual diode mesas 18. A top view of the device at this stage of fabrication is shown in the view of FIG. 5.

Figure 5:
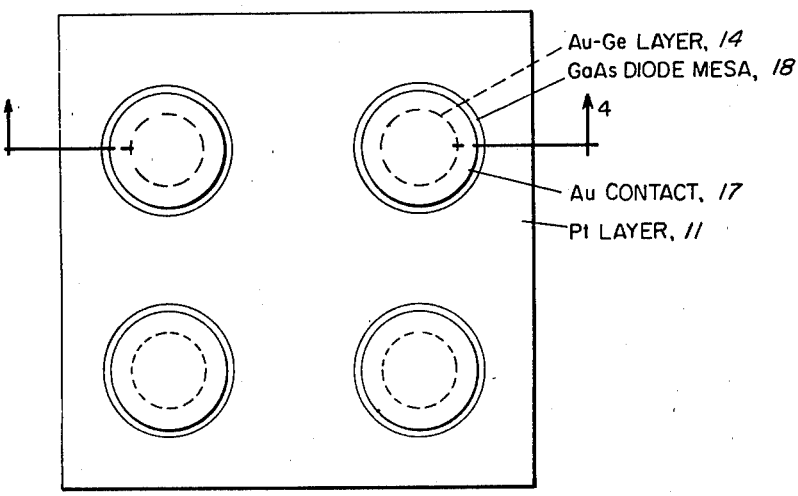
FIG. 5 is a top view of the device as shown in FIG. 4.

Referring next to the cross-sectional view of FIG. 6, there is shown the four-mesa device of FIGS. 4 and 5 assembled in a double-heat sink microwave diode package in accordance with the invention. Gold-contact layer 16 is soldered to the upper surface of metallic diode base 28 with solder joint 27. Diode base 28 is preferably a highly thermally and electrically conductive metal such as copper which may have a coating of gold on its outer surface. The lower portion of base 28 is threaded and provided with a screw slot 29 for package mounting.

Base 28 forms a heat sink for the heat produced within diode mesas 18 and transmitted through gold-contact layer 16. Base flange 31 is provided around the upper portions of diode base 28 to form a support for cylindrically-shaped ceramic spacer 26. Ceramic spacer 26 is both thermally and electrically insulating. Annularly-shaped flange 25 is secured atop ceramic spacer 26.

In accordance with the invention, upper heat sink 32 is provided with the interior space of ceramic spacer 26 in electrical and thermal contact with gold contacts 17 of diode mesas 18. Upper heat sink 32 is formed of a highly thermally and electrically conductive metal such as gold-plated copper as used for base 28. The volume of upper heat sink 32 should be much larger than that of diode mesas 18 to provide a low thermal resistance for heat flowing out of the upper ends of diode mesas 18. A flexible foil-flanged plug 24, in thermal and electrical contact with the upper surface of upper heat sink 32, is secured to the upper surface of flange 25. A metal lid 23 covers and is also in electrical and thermal contact with foil-flanged plug 24. In actual device operation, such as in an amplifier or oscillator circuit, a contact rod abuts the surface of lid 23 providing continuation of the upper heat path.

The device shown in FIG. 6 has numerous advantages over the devices of prior art in its heat-flow characteristics, allowing it to be employed at higher power levels than were heretobefore possible with diode devices of similar dimensions. First, by providing multiple diode mesas, rather than a single mesa of the same total junction area, the thermal resistance between the junction or any point within any one of the diode mesas is substantially lower than for a larger single mesa device. An arrangement of three mesas or other devices in a substantially equilateral triangular arrangement, or four devices in a rectangular arrangement is preferred. Secondly, because heat sinks are provided upon both sides of the diode mesas, heat may flow outwardly from two directions from the heat generating areas within the diode material. In this manner, a second large reduction in overall thermal resistance and hence junction temperature is achieved.

Figure 7:
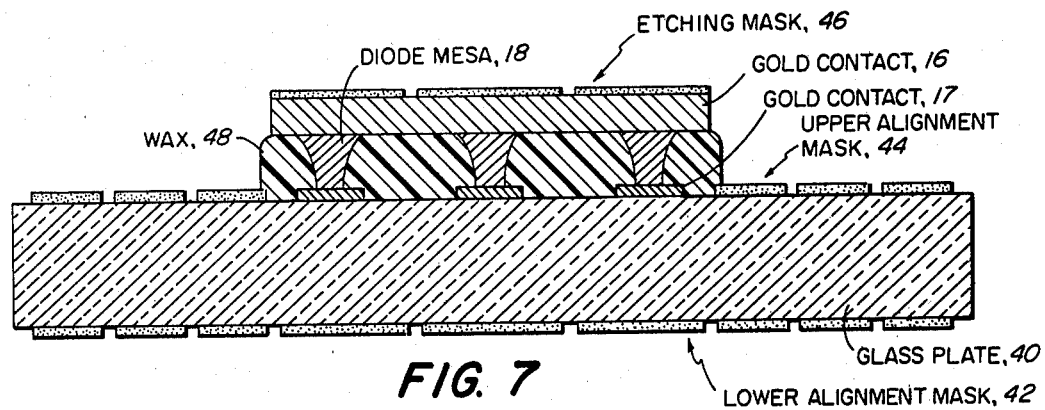
FIG. 7 is a cross-sectional view showing steps in a dicing operation in accordance with the invention.

Referring next to FIG. 7, there is shown a cross-sectional view useful in explaining a dicing procedure in accordance with the invention. A device in the same state of construction as illustrated in FIGS. 4 and 5 is mounted upon transparent glass plate 40 with a non-reactive wax 48 filling the space between and around diode mesas 18 and gold contact 17. The wax protected device is pressed against the upper surface of glass plate 40 with gold contacts abutting the surface. From the lower surface of glass plate 40 it is then possible to visually distinguish between gold contacts 17 and wax 48 lying therebetween, hence making it possible to determine where the dicing cuts are to be made.

The lower surface of glass plate 40 is then covered with a transparent layer of photoresist material which is masked with a photographic mask having lines corresponding to the positions of the dicing cuts and exposed to form lower alignment mask 42 having lines corresponding to those along which the dicing cuts are to be made through gold contact layer 16. Other such lines are provided for alignment purposes in a grid pattern beyond the periphery of wax 48.

Next, a second layer of photoresist material is deposited upon the upper surface of glass plate 40 and the upper surface of gold-contact layer 16. The same mask which was used to expose lower alignment mask 42 is aligned visually with the portions of the grid pattern extending beyond the periphery of wax 48. The photoresist layer is then exposed and chemically etched to remove the photoresist material in the lines along which dicing is to be made.

Figure 8:
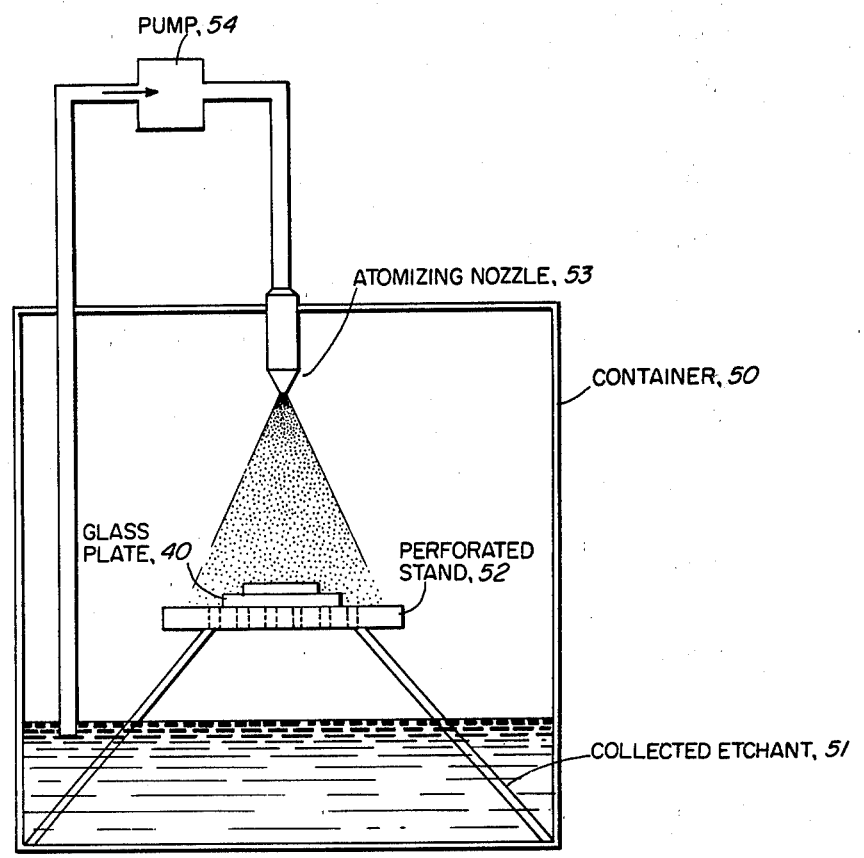
FIG. 8 shows a cross-sectional view of a spray-etching operation as used in the dicing operation of the invention.

The device at the stage of construction as shown in FIG. 7 is then placed within a spray-etching system illustrated in FIG. 8. The device is placed upon perforated stand 52 positioned above a tank of collected etchant 51. Pump 54 circulates the collected etchant 51 through atomixing nozzle 53 spraying it toward the exposed dicing lines. The etching process continues until the desired portions of gold-contact layer 16 have been completely etched through. Wax 48 is then removed, allowing the devices to be separated.

Of course, as before, many more than three diode mesas would ordinarily be provided on a wafer that is being diced, three only being shown for clarity of illustration. The same technique may be employed for etching apart single diode mesas or groups of diode mesas. It may also be readily appreciated that any shape heat sink may be produced with the technique of the invention.

For example, a circular heat sink may be produced for a device having three mesas positioned in an equilateral triangular arrangement so that each mesa has the same effective thermal resistance. This could not have been done with the rectilinear technique of the prior art.

This completes the description of the preferred embodiments of the invention. Although preferred embodiments have been described, it is believed that numerous modifications and alterations thereto would be apparent to one having ordinary skill in the art without departing from the spirit and scope of the invention.

What is claimed is:

1. The method comprising the steps of:
   providing a body of semiconductor material;
   sputtering a Schottky-barrier forming metal upon at least a portion of a surface of said body of semiconductor material at a sputtering power level sufficient to cause alloying between a portion of said semiconductor material and at least a portion of the sputtered Schottky-barrier forming metal;
   sputtering a layer of refractory metal over said sputtered Schottky-barrier forming metal; and
   sputtering a layer of highly conductive metal over said layer of refractory metal.

2. The method of claim 1 further comprising the step of:
   heating said body of semiconductor material to a temperature in the range of 300° to 350° C. prior to sputtering said Schottky-barrier forming metal.

3. The method of claim 1 wherein said step of sputtering a layer of refractory metal comprises:
   sputtering said layer of refractory metal at a sputtering power level sufficient to cause alloying between at least portions of the Schottky-barrier forming metal not alloyed with said semiconductor material and a portion of said layer of refractory material.

4. The method of claim 3 wherein said semiconductor material comprises:
   gallium arsenide.

5. The method of claim 4 wherein:
   said Schottky-barrier forming metal comprises platinum.

6. The method of claim 5 wherein:
   said refractory metal comprises a material selected from the group consisting of titanium, tungsten and hafnium and said highly conductive metal comprises gold.

7. The method comprising the steps of:
   providing a body of gallium arsenide semiconductor material;
   heating said body to a temperature in the range of 300° to 350° C.;
   sputtering a layer of platinum upon a first surface of said body at a sputtering power level in the range of 0.5 to 2.7 watts/cm$^2$ to a thickness in the range of 100 to 200 Å;
   cooling said body to a temperature below 40° C.;
   sputtering a layer of titanium over said layer of platinum at a sputtering power in the range of 1.4 to 4.4 watts/cm$^2$ to a thickness in the range of 1000 to 2000 Å; and
   sputtering a layer of gold over said layer of titanium.

8. The method of claim 7 further comprising the steps of:
   evaporating a layer of gold-germanium alloy upon a second surface of said body;

and plating a layer of gold over said layer of gold-germanium alloy.

9. The method of claim 8 further comprising the steps of:

etching away portions of said gold layer plated over said layer of gold-germanium alloy leaving the remaining portions in the shape of one or more discs; and etching away portions of said layer of gold-germanium alloy and said body of semiconductor material leaving the remaining portions of said layer of gold-germanium alloy and said body of semiconductor material in the form of mesas underlying the discs formed from said gold layer.

10. The method of claim 9 further comprising the step of:

attaching a heat sink to said discs.

* * * * *